United States Patent
Zhang et al.

(10) Patent No.: US 9,368,538 B2
(45) Date of Patent: Jun. 14, 2016

(54) IMAGE SENSOR DEVICE AND METHOD OF MANUFACTURING THE SAME

(71) Applicant: Semiconductor Manufacturing International (Shanghai) Corporation, Shanghai (CN)

(72) Inventors: HaiFang Zhang, Shanghai (CN); Herb He Huang, Shanghai (CN); Xuan Jie Liu, Shanghai (CN); Xia Feng, Shanghai (CN); Pinghuan Wu, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/692,439

(22) Filed: Apr. 21, 2015

(65) Prior Publication Data

US 2016/0093656 A1    Mar. 31, 2016

(30) Foreign Application Priority Data

Sep. 25, 2014    (CN) .......................... 2014 1 0495034

(51) Int. Cl.
*H01L 31/0203*    (2014.01)
*H01L 27/146*    (2006.01)

(52) U.S. Cl.
CPC .... *H01L 27/14636* (2013.01); *H01L 27/14687* (2013.01)

(58) Field of Classification Search
USPC ......................................................... 257/433
See application file for complete search history.

(56) References Cited

U.S. PATENT DOCUMENTS

| | | | | | |
|---|---|---|---|---|---|
| 7,221,051 | B2 * | 5/2007 | Ono | ................... | H01L 27/14618 257/434 |
| 7,456,497 | B2 * | 11/2008 | Higashi | ................... | B81B 7/007 257/678 |
| 7,495,304 | B2 * | 2/2009 | Lin | ................... | H01L 27/14618 257/432 |
| 8,048,708 | B2 * | 11/2011 | Borthakur | ........... | H01L 21/6835 257/433 |
| 8,796,800 | B2 * | 8/2014 | Oganesian | ........ | H01L 27/14618 257/433 |
| 2007/0152148 | A1 * | 7/2007 | Chao | ................. | H01L 27/14618 250/239 |
| 2009/0039455 | A1 * | 2/2009 | Chien | ............... | H01L 27/14618 257/433 |
| 2009/0294779 | A1 * | 12/2009 | Ida | ..................... | H01L 27/14618 257/82 |

* cited by examiner

*Primary Examiner* — Luan C Thai
(74) *Attorney, Agent, or Firm* — Innovation Counsel LLP

(57) ABSTRACT

An image sensor device includes a top substrate and a subassembly. The top substrate includes a plurality of connection pillars, and the subassembly includes a plurality of connection pads. The connection pillars on the top substrate are bonded to the connection pads in the subassembly. The connection pillars are formed of a first metal and the connection pads are formed of a second metal.

19 Claims, 6 Drawing Sheets

IMAGE SENSOR DEVICE AND METHOD OF MANUFACTURING THE SAME

CROSS-REFERENCE TO RELATED APPLICATION

This application claims priority to Chinese Patent Application No. 201410495034.2 filed on Sep. 25, 2014, the disclosure of which is incorporated herein by reference in its entirety.

BACKGROUND

1. Technical Field

The present disclosure relates to the field of semiconductors, and more particularly to an image sensor device and a method of manufacturing the same.

2. Description of the Related Art

Advanced packaging solutions, for example through-silicon via (TSV) process technology, have been implemented for complementary metal-oxide-semiconductor (CMOS) image sensors (the CMOS image sensors abbreviated herein as "CIS"). A CIS built using TSV process technology is typically formed on a wafer level chip scale package (WLCSP), which offers cost savings and form factor advantages over a conventional chip on board (COB) package.

As TSV process technology continues to develop, WLCSP is being applied during and post-TSV processing, and TSV dimensions are being reduced, so as to meet the requirements of high-end CIS products. TSV dimensions may include, for example, dimensions of the pads for interconnecting the TSVs.

In a CIS WLCSP, a height of the TSV (as measured from a top pad to a bottom package bump) depends on a depth of the through via (typically less than 300 µm). As a result, the silicon wafer (in which the TSV is formed) has to undergo backside thinning to reduce the thickness of the wafer to less than 300 µm. The silicon wafer is typically mounted (bonded) to a supporting substrate prior to thinning.

After the silicon wafer has been mounted to the supporting substrate, the bonded structure undergoes TSV processing steps including backgrinding, etching, formation of isolation structures, etc. Good bonding quality is necessary to minimize the stresses exerted on the bonded structure during TSV processing.

SUMMARY

The present disclosure is directed towards improving the bonding quality in image sensor devices.

According to an embodiment of the inventive concept, an image sensor device is provided. The image sensor device includes: a top substrate including a plurality of connection pillars; and a subassembly including a plurality of connection pads, wherein the connection pillars on the top substrate are bonded to the connection pads in the subassembly, and wherein the connection pillars are formed of a first metal and the connection pads are formed of a second metal.

In one embodiment, the top substrate may be made of glass.

In one embodiment, the subassembly may include a bottom substrate made of silicon.

In one embodiment, the connection pads may be disposed at two end portions of the bottom substrate.

In one embodiment, the subassembly may include an optically transmissive region, and the connection pads may be disposed outside the optically transmissive region in the subassembly.

In one embodiment, the first metal and the second metal may be copper.

In one embodiment, the first metal may be aluminum and the second metal may be germanium.

In one embodiment, the subassembly may further include: a plurality of optical components disposed on the bottom substrate, wherein the connection pads may be disposed adjacent to the edge-most optical components on the bottom substrate.

According to another embodiment of the inventive concept, a method of manufacturing an image sensor device is provided. The method includes: forming a plurality of connection pillars on a top substrate; providing a subassembly comprising a plurality of connection pads; and bonding the connection pillars on the top substrate to the connection pads in the subassembly, wherein the connection pillars are formed of a first metal and the connection pads are formed of a second metal.

In one embodiment, the top substrate may be made of glass.

In one embodiment, the subassembly may include a bottom substrate made of silicon.

In one embodiment, the connection pads may be formed at two end portions of the bottom substrate.

In one embodiment, the subassembly may include an optically transmissive region, and the connection pads may be disposed outside the optically transmissive region in the subassembly.

In one embodiment, forming the plurality of connection pillars may further include: forming a seed layer on the top substrate; forming a patterned photoresist on a portion of the seed layer, the patterned photoresist exposing two end portions of the seed layer; electroplating the seed layer using the patterned photoresist as a mask, so as to form the connection pillars at the two end portions of the seed layer; and removing the patterned photoresist and the portion of the seed layer.

In one embodiment, forming the plurality of connection pillars may further include: forming a seed layer on the top substrate; electroplating the seed layer to form a metal layer; and etching the metal layer so as to form the connection pillars at two end portions of the metal layer.

In one embodiment, the first metal and the second metal may be copper.

In one embodiment, the first metal may be aluminum and the second metal may be germanium.

In one embodiment, the subassembly may further include: a plurality of optical components disposed on the bottom substrate, wherein the connection pads may be disposed adjacent to the edge-most optical components on the bottom substrate.

In one embodiment, the connection pillars on the top substrate may be bonded to the connection pads in the subassembly at a bonding temperature ranging from about 200° C. to about 500° C., a bonding pressure ranging from about 10 kN to about 100 kN, and a bonding time ranging from about 0.5 hrs to about 3 hrs.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Figure 1:
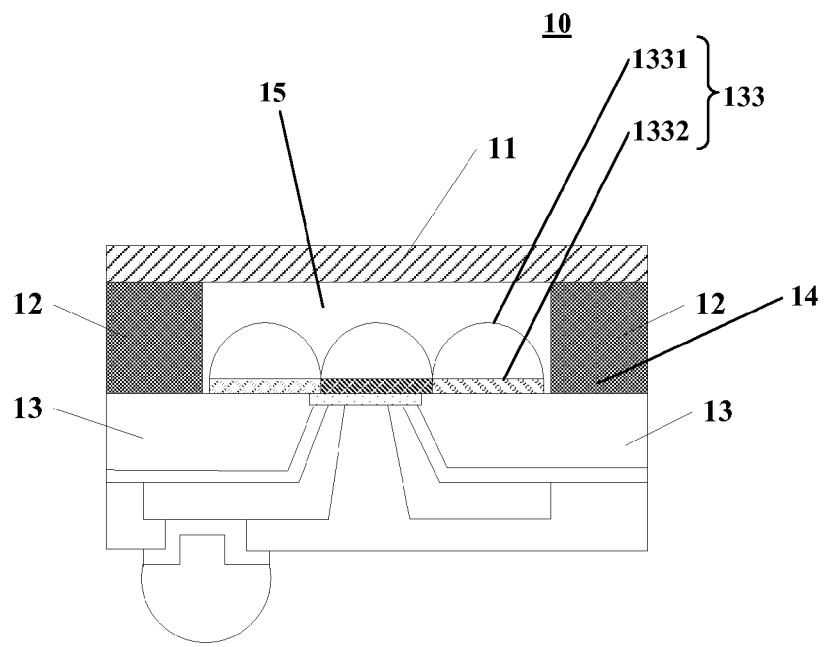
FIG. 1 illustrates a schematic cross-sectional view of an image sensor device.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It should be understood that when an element or layer is referred to as "in", "adjacent to", "connected to", or "coupled to" another element or layer, it can be directly on the other element or layer, adjacent, connected or coupled to the other element or layer. In some instances, one or more intervening elements or layers may be present. In contrast, when an element is referred to as being "directly on", "directly adjacent to", "directly connected to", or "directly coupled to" another element or layer, there are no intervening elements present or layer. It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

Spatially relative terms, such as "beneath", "below", "lower", "above", "upper" and the like, may be used herein for ease of description to describe one element or feature's spatial relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

Exemplary embodiments are described herein with reference to cross-sectional illustrations that are schematic illustrations of idealized exemplary embodiments (and intermediate structures) of the inventive concept. As such, variations from the shapes of the illustrations as a result of, for example, manufacturing techniques and/or tolerances, are to be expected. Thus, the exemplary embodiments should not be construed as being limited to the particular shapes of regions illustrated herein, but may also include deviations in shapes that result, for example, from manufacturing tolerances. The regions illustrated in the figures are schematic in nature, and their shapes are not intended to illustrate the actual shape of a region of a device, and should not be construed to limit the scope of the inventive concept.

It should be understood that the inventive concept is not limited to the embodiments described herein. Rather, the inventive concept may be modified in different ways to realize different embodiments.

FIG. 1 illustrates a schematic cross-sectional view of an image sensor device 10. Referring to FIG. 1, a top substrate 11 and a bottom substrate 13 are bonded together in an optically non-transmissive region 14 using a bonding material 12. The top substrate 11 may be made of a transparent material, for example, glass. The bottom substrate 13 may be made of a substrate material suitable for forming through-vias, for example, silicon. An optically transmissive region 15 is defined by a cavity between the top substrate 11 and the bottom substrate 13. The optically non-transmissive region 14 is defined by the area outside the cavity. As shown in FIG. 1, optical components 133 are disposed on the bottom substrate 13 in the cavity of the optically transmissive region 15. The optical components 133 include a plurality of microlens 1331 and filters 1332. The bonding material 12 may be a glue made of an organic material.

After the top substrate 11 and the bottom substrate 13 have been bonded together, the bonded structure undergoes TSV processing steps including backgrinding, etching, formation of isolation structures, etc. Good bonding quality is necessary to minimize the stresses exerted on the bonded structure during TSV processing. The bonding quality depends in part on the particle uniformity within the bonding material 12 and the bond line thickness of the bonding material 12.

In particular, the type of bonding material may affect subsequent processing of the bonded structure. For example, chemical vapor deposition (CVD) may be performed on the bonded structure to form TSVs with smaller dimensions. However, if the bonding material 12 is made of an organic material, outgassing of the bonding material 12 may occur as a result of high processing temperatures during CVD. The outgassing may interfere with the film deposition during CVD and cause layer peeling.

Figure 2:
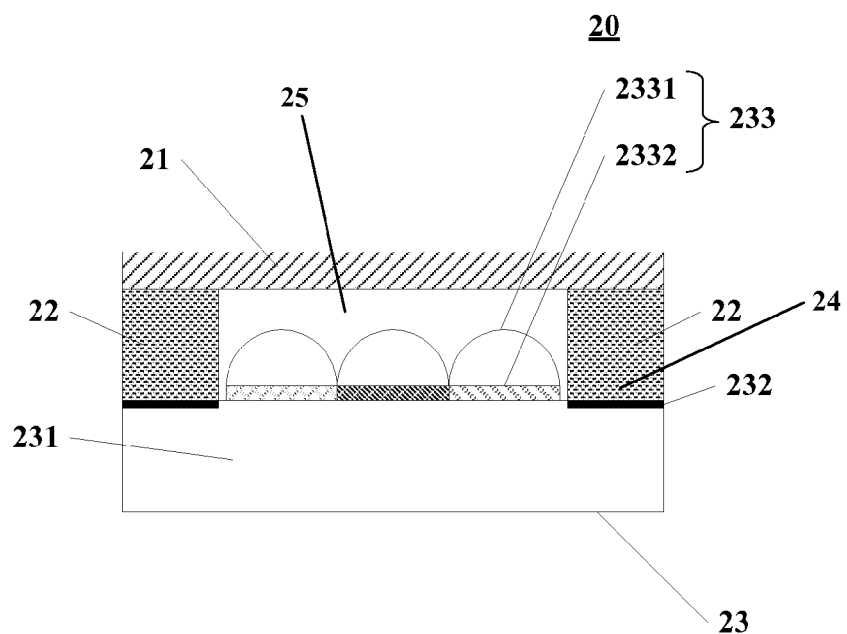
FIG. 2 illustrates a schematic cross-sectional view of an image sensor device according to an embodiment.

FIG. 2 illustrates a schematic cross-sectional view of an image sensor device according to an embodiment. Referring to FIG. 2, an image sensor device 20 includes a top substrate 21, connection pillars 22 formed on the top substrate 21, and a subassembly 23 bonded to the top substrate 21 by the connection pillars 22. The top substrate 21 may be made of a transparent material, for example, glass. The connection pillars 22 may be made of one or more metals.

As shown in FIG. 2, the connection pillars 22 on the top substrate 21 are bonded to connection pads 232 in the subassembly 23. As one skilled in the art would appreciate, the term "subassembly" as used herein may refer to any structure that is disposed opposite, and bonded to, the top substrate 21. However, the "subassembly" need not be limited to the embodiment shown in FIG. 2, and can be modified to include different structures or subassemblies having different components or functions.

The subassembly 23 includes a bottom substrate 231. The bottom substrate 231 may be made of a substrate material suitable for forming through-vias, for example, silicon. As shown in FIG. 2, the connection pads 232 are formed at two end portions of the bottom substrate 231. The connection pads 232 may be made of one or more metals.

An optically transmissive region 25 is defined by a cavity between the top substrate 21 and the bottom substrate 231. An optically non-transmissive region 24 is defined by the area outside the cavity.

As shown in FIG. 2, a plurality of optical components 233 are disposed on the bottom substrate 231 in the cavity of the optically transmissive region 25. As shown in FIG. 2, the subassembly 23 includes three optical components 233. However, the inventive concept is not limited thereto, and may include any number of optical component 233. The optical components 233 include a plurality of microlens 2331 and filters 2332. The connection pads 232 are disposed in the optically non-transmissive region 24 of the subassembly 23. Specifically, the connection pads 232 are disposed adjacent to the edge-most optical components 233, as shown in FIG. 2.

When the top substrate 21 and the subassembly 23 are bonded together, the connection pads 232 will be directly bonded to the connection pillars 22. In one embodiment, the connection pillars 22 and the connection pads 232 are bonded using a compression bonding method, so as to bond together the top substrate 21 and the subassembly 23.

The filters 2332 may come in different colors. For example, in one embodiment, the three filters 2332 in FIG. 2 may be red, green, and blue, respectively (from left to right). However, the number, color, and layout of the filters need not be limited to the embodiment shown in FIG. 2, and can be modified in different ways by those skilled in the art.

In one embodiment, the connection pillars 22 and the connection pads 232 are made of copper. Nevertheless, those skilled in the art would appreciate that the connection pillars 22 and the connection pads 232 may be formed of other metals suitable for metallic bonding. For example, in another embodiment, the connection pillars 22 may be made of aluminum, and the connection pads 232 may be made of germanium.

Figure 3:
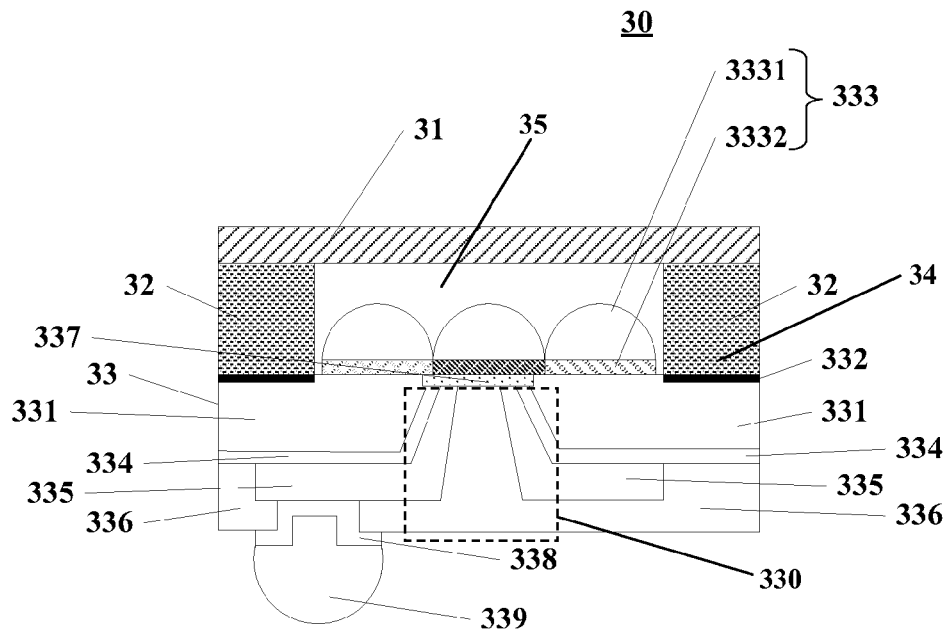
FIG. 3 illustrates a schematic cross-sectional view of an image sensor device according to another embodiment.

FIG. 3 illustrates a schematic cross-sectional view of an image sensor device according to another embodiment. Referring to FIG. 3, an image sensor device 30 includes a top substrate 31, connection pillars 32 formed on the top substrate 31, and a subassembly 33 bonded to the top substrate 31 by the connection pillars 32. Specifically, the connection pillars 32 on the top substrate 31 are bonded to connection pads 332 in the subassembly 33. The top substrate 31 may be made of a transparent material, for example, glass. The connection pillars 32 may be made of one or more metals.

The subassembly 33 includes a bottom substrate 331. The bottom substrate 331 may be made of a substrate material suitable for forming through-vias, for example, silicon. As shown in FIG. 3, the connection pads 332 are formed at two end portions of the bottom substrate 331. The connection pads 332 may be made of one or more metals.

An optically transmissive region 35 is defined by a cavity between the top substrate 31 and the bottom substrate 331. An optically non-transmissive region 34 is defined by the area outside the cavity.

As shown in FIG. 3, a plurality of optical components 333 are disposed on the bottom substrate 331 in the cavity of the optically transmissive region 35. As shown in FIG. 3, the subassembly 33 includes three optical components 333. However, the inventive concept is not limited thereto, and may include any number of optical component 333. The optical components 333 include a plurality of microlens 3331 and filters 3332. The connection pads 332 are disposed in the optically non-transmissive region 34 of the subassembly 33. Specifically, the connection pads 332 are disposed adjacent to the edge-most optical components 333, as shown in FIG. 3.

Referring to FIG. 3, the subassembly 33 further includes a through-hole 330 (denoted by the dotted region), a first insulating layer 334, a first metal wiring 335, a second insulating layer 336, a second metal wiring 337, an under-bump metallization (UBM) 338, and a packaging bump 339.

The through-hole 330 is formed in a portion of the substrate 331.

The first insulating layer 334 is disposed on the substrate 331 and extends into the through-hole 330.

The first metal wiring 335 is disposed on a portion of the first insulating layer 334 and extends into the through-hole 330. The first metal wiring 335 may be, for example, a copper wire.

The second insulating layer 336 is disposed on a portion of the first insulating layer 334 and on a portion of the first metal wiring 335. The second insulating layer 336 extends into the through-hole 330.

The second metal wiring 337 is disposed between the optical components 333 and the through-hole 330. The second metal wiring 337 may be, for example, a copper wire.

The UBM 338 is disposed on a portion of the second insulating layer 336.

The packaging bump 339 is disposed on the UBM 338.

In one embodiment, the first insulating layer 334 and the second insulating layer 336 may be made of an oxide (e.g., silicon oxide), a nitride (e.g., silicon nitride), or any combination of oxides and nitrides. The UBM 338 may be made of a suitable metal such as copper. Those skilled in the art should appreciate that the aforementioned materials are merely exemplary, and that the scope of the inventive concept is not limited thereto.

In the exemplary image sensor devices 20 and 30, metal materials are used for the connection pillars and connection pads between the top substrate and the subassembly. Compared to organic materials, the metal materials are able to withstand higher temperatures and can provide better mechanical support. In addition, metal materials have better material uniformity, and can be formed having a more uniform bond line thickness. As such, the deposition of the metal materials is easier to control from a process standpoint.

It is noted that backend or post-processing temperatures can go up to 265° C. At those temperatures, connection pillars made of an organic material may start to deform if the temperatures exceed the glass transition temperature ($T_g$) of the organic material. In contrast, the metal materials for the connection pillars and connection pads are more robust under backend or post-processing temperatures, and will not undergo any significant change in physical/material properties at those temperatures.

Another advantage of the metal materials is that there is no material outgassing that may affect subsequent processing. As previously mentioned, if the bonding material is an organic material, outgassing of the bonding material may occur under high CVD process temperatures, and the outgassing may interfere with film deposition during CVD and cause layer peeling. Unlike the organic material, the metal materials will not experience outgassing during CVD film growth that may result in layer peeling. Accordingly, the quality of the exemplary image sensor devices will be significantly improved when metal materials are used for the connection pillars and the connection pads.

Figure 4:
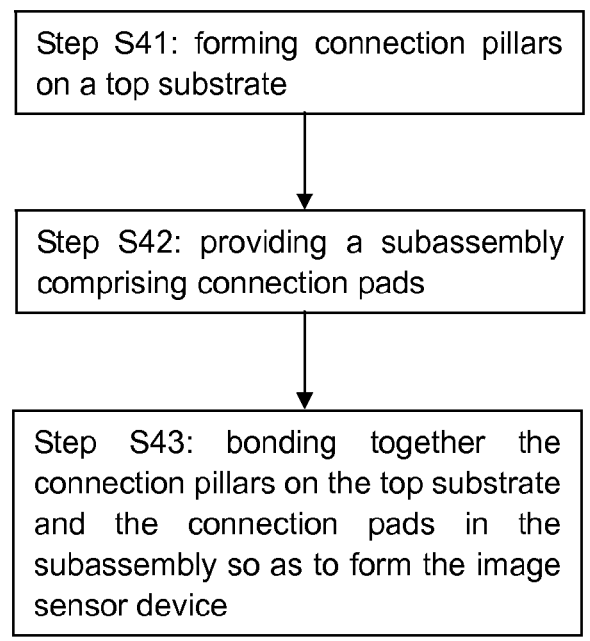
FIG. 4 is a flowchart illustrating a method of manufacturing an image sensor device according to an embodiment.
Figure 5A:
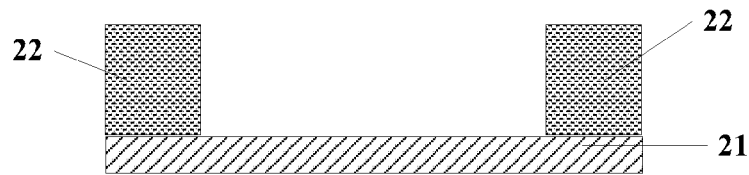
FIGS. 5A, 5B, and 5C depict schematic cross-sectional views of an image sensor device at different stages of manufacture according to the method of FIG. 4.

Next, a method of manufacturing an image sensor device according to an embodiment will be described with reference to FIGS. 4 and 5. Specifically, FIG. 4 is a flowchart of the method, and FIGS. 5A, 5B, and 5C depict schematic cross-sectional views of the image sensor device at different stages of manufacture. The method includes the following steps.

In Step S41, connection pillars are formed on a top substrate. For example, as shown in FIG. 5A, connection pillars 22 are formed on a top substrate 21. The top substrate 21 may be made of a transparent material, for example, glass. In one embodiment, the connection pillars 22 are made of copper. Nevertheless, those skilled in the art would appreciate that the connection pillars 22 may be made of other metals, for example, aluminum.

In Step S42, a subassembly comprising connection pads is provided. For example, as shown in FIG. 5B, a subassembly 23 includes a bottom substrate 231 and connection pads 232 formed at two end portions of the bottom substrate 231. Specifically, the connection pads 232 are formed adjacent to the edge-most optical components 233 disposed on the bottom substrate 231. The bottom substrate 231 may be made of a substrate material suitable for forming through-vias, for example, silicon.

In one embodiment, the connection pads 232 are made of copper. Nevertheless, those skilled in the art would appreciate that the connection pads 232 may be formed of other metals, for example, germanium.

In one embodiment, if the connection pillars 22 are made of copper, the connection pads 232 may also be made of copper.

In another embodiment, if the connection pillars 22 are made of aluminum, the connection pads 232 may be made of germanium.

Nevertheless, those skilled in the art would appreciate that the connection pillars 22 and the connection pads 232 may be formed of any combination of metals suitable for metallic bonding.

Figure 5B:
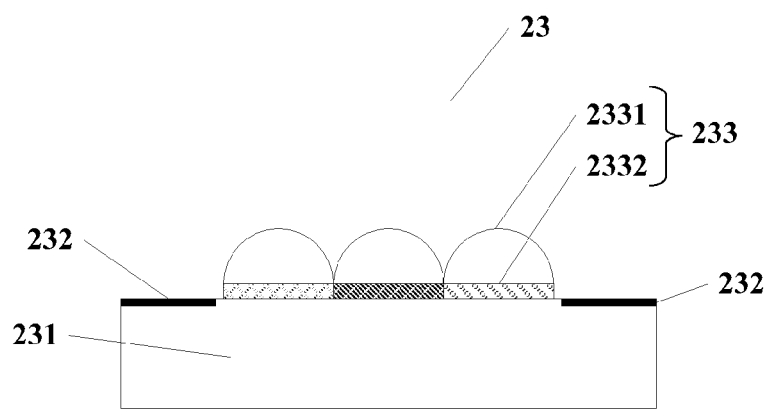
Figure 5C:
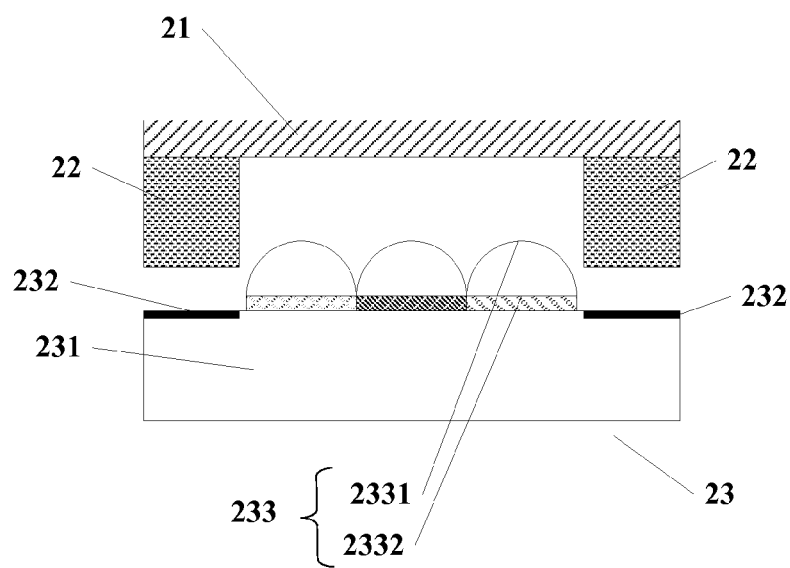

Referring to FIG. 5B, the optical components 233 include a plurality of microlens 2331 and filters 2332 formed on the substrate 231. Since the process for forming the microlens 2331 and the filters 2332 is known to those skilled in the art, a detailed description of the formation of the microlens 2331 and the filters 2332 shall be omitted.

The connection pads 232 may be formed on the bottom substrate 231 in different ways. In one embodiment, the connection pads 232 are deposited at the desired locations on the substrate 231. In another embodiment, a metal layer (e.g., a copper layer) is deposited on the top surface or the bottom surface of the bottom substrate 231, and only the portions of the metal layer (to be used for bonding) are exposed. In the aforementioned embodiment, the metal layer may be covered by a layer (e.g. an insulating layer), and openings are then formed in the layer to expose the portions of the metal layer (to be used for bonding with the connection pillars on the top substrate). It should be noted that the metal layer can also be used for heat dissipation.

In Step S43, the connection pillars on the top substrate and the connection pads in the subassembly are bonded together so as to form the image sensor device. As shown in FIG. 5C, the connection pillars 22 on the top substrate 21 are bonded to the connection pads 232 in the subassembly 23, thereby forming the structure illustrated in FIG. 2. In one embodiment, the connection pillars 22 and the connection pads 232 are made of copper, and are bonded together using compression bonding to form a Cu—Cu bond. The process conditions for the compression bonding may include: a bonding temperature ranging from about 200° C. to about 500° C.; a bonding pressure ranging from about 10 kN to about 100 kN; and a bonding time ranging from about 0.5 hrs to about 3 hrs. It should be noted that the above process conditions are merely exemplary, and may be modified accordingly by those skilled in the art.

In one embodiment, after the image sensor device of FIG. 2 has been formed, subsequent processing may be performed. The processing may include, for example, processes for forming silicon vias, insulating layers, metal wiring, packaging bumps, etc., so as to form the image sensor device shown in FIG. 3. Since the aforementioned processes are known to those skilled in the art, a detailed description of those processes shall be omitted.

Figure 6:
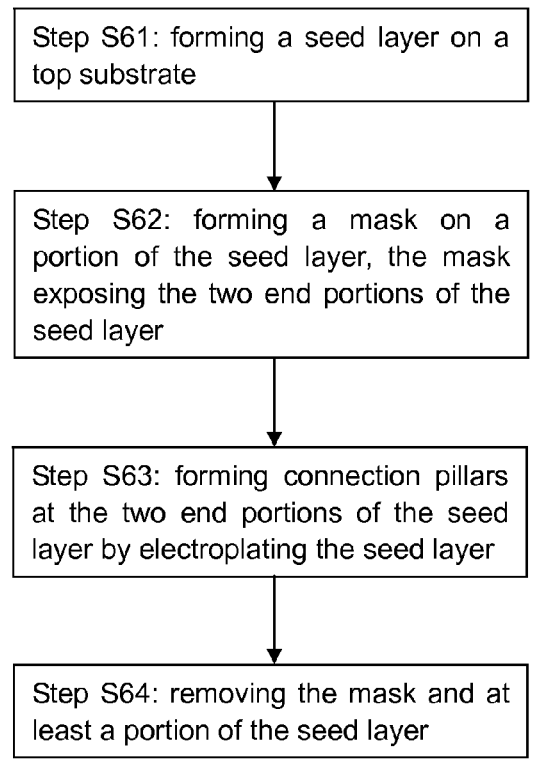
FIG. 6 is a flowchart illustrating a method of forming a connection pillar on a bottom substrate according to an embodiment.

Next, a method of forming connection pillars on a top substrate according to an embodiment will be described with reference to FIGS. 6 and 7A through 7E. Specifically, FIG. 6 is a flowchart illustrating the method, and FIGS. 7A, 7B, 7C, 7D, and 7E depict schematic cross-sectional views of the resulting structure at different stages of manufacture.

Figure 7A:
FIGS. 7A, 7B, 7C, 7D, and 7E depict schematic cross-sectional views of the resulting structure at different stages of manufacture according to the method of FIG. 6.

In Step S61, a seed layer is formed on a top substrate. For example, as shown in FIG. 7A, a seed layer 73 is formed on a top substrate 71. The top substrate 71 may be made of a transparent material, for example, glass. The seed layer 73 may be formed by depositing titanium copper on the top substrate 71 using physical vapor deposition (PVD). Nevertheless, it should be appreciated that the seed layer may be formed by depositing other suitable materials on the top substrate using appropriate deposition processes.

Figure 7B:
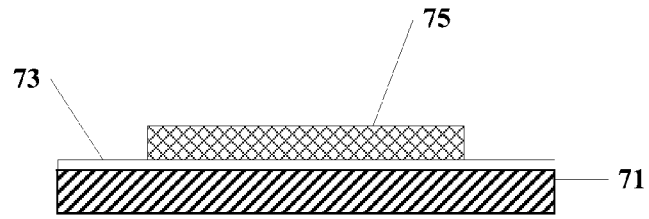

In Step S62, a mask is formed on a portion of the seed layer, the mask exposing the two end portions of the seed layer. For example, in one embodiment, a photoresist 75 is formed on the seed layer 73. The photoresist 75 is then patterned so as to expose the two end portions of the seed layer 73 (for example, as shown in FIG. 7B). Specifically, the two end portions of the seed layer 73 correspond to the locations of the connection pads 232 in the subassembly 23 of FIG. 2.

Figure 7C:
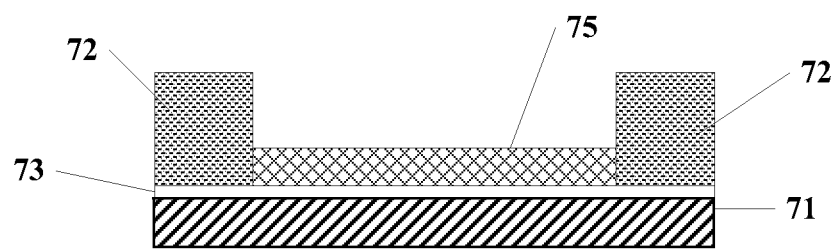

In Step S63, connection pillars are formed at the two end portions of the seed layer by electroplating the seed layer. For example, as shown in FIG. 7C, the seed layer 73 is electroplated so as to form connection pillars 72 at the two end portions of the seed layer 73. In one embodiment, the seed layer 73 is a titanium copper seed layer, and the connection pillars 72 are copper pillars.

Figure 7D:
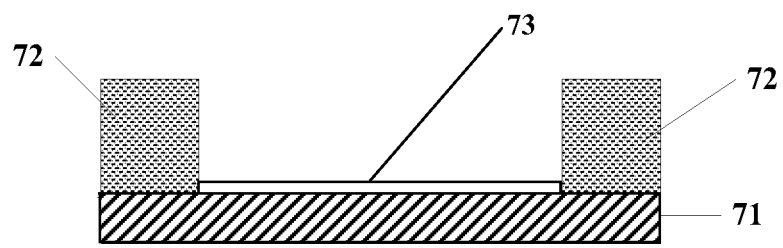
Figure 7E:

In Step S64, the mask and at least a portion of the seed layer are removed. For example, the patterned photoresist 75 is first removed, as shown in FIG. 7D. Next, the portion of the seed layer 73 covered by the patterned photoresist 75 is removed, as shown in FIG. 7E. In one embodiment, the portion of the seed layer 73 may be removed by wet etching, so as to expose at least a portion of the top substrate 71. As shown in FIG. 7E, the portion of the top substrate 71 that is not covered by the connection pillars 72 is exposed after the seed layer 73 has been etched.

Accordingly, connection pillars may be formed on the top substrate using Steps S61 through S64 described above. Although Steps S61 through S64 are described using copper pillars as an example, it should be noted that a similar approach may be adopted for forming pillars made of other metals. For example, in another embodiment, a seed layer for forming aluminum pillars may be deposited, and the aluminum pillars may be subsequently formed by plating the seed layer.

Figure 8:
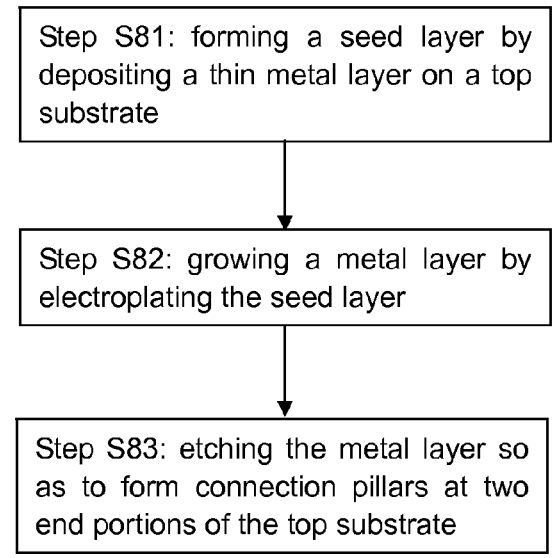
FIG. 8 is a flowchart illustrating a method of forming a connection pillar on a bottom substrate according to another embodiment.
Figure 9A:
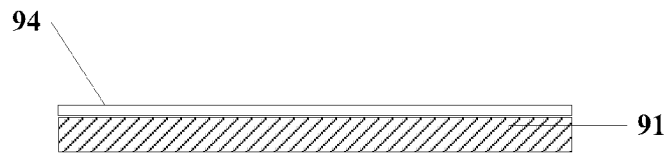
FIGS. 9A, 9B, and 9C depict schematic cross-sectional views of the resulting structure at different stages of manufacture according to the method of FIG. 8.
Figure 9B:
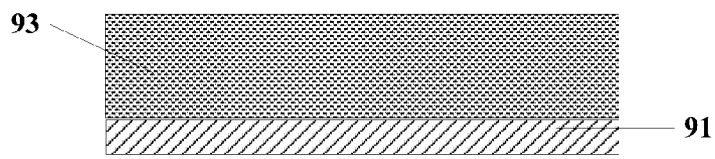
Figure 9C:
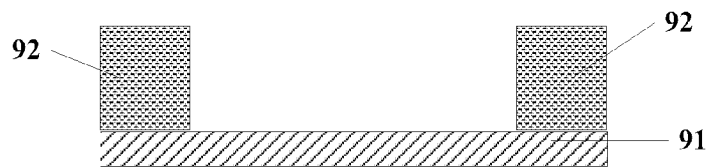

Next, a method of forming connection pillars on a top substrate according to another embodiment will be described with reference to FIGS. 8 and 9A through 9C. Specifically, FIG. 8 is a flowchart illustrating the method, and FIGS. 9A, 9B, and 9C depict schematic cross-sectional views of the structure at different stages of manufacture.

In Step S81, a seed layer is formed by depositing a thin metal layer on a top substrate. As shown in FIG. 9A, a seed layer 94 is formed by depositing a thin metal layer on a top substrate 91. The top substrate 91 may be made of a transparent material, for example, glass. In one embodiment, the seed layer 94 is formed depositing a thin layer of titanium copper on the top substrate 91 using physical vapor deposition (PVD).

In Step S82, a metal layer is grown by electroplating the seed layer. As shown in FIG. 9B, electroplating is performed on the seed layer 94 so as to form a metal layer 93 on the top substrate 91. For example, in one embodiment, electroplating may be performed on a titanium copper seed layer to grow a copper layer. The copper layer is used to form copper pillars, as described below. It should be noted that the inventive concept is not limited thereto, and other appropriate seed layers may be used to grow other metal layers (for example, an aluminum layer).

In Step S83, the metal layer is etched so as to form connection pillars at two end portions of the top substrate. For example, in one embodiment, the metal layer 93 may be etched using photolithography so as to form connection pillars 92 at the two end portions of the top substrate 91, thereby producing the structure shown in FIG. 9C. Specifically, the locations of the connection pillars 92 correspond to the locations of the connection pads 232 in the subassembly 23 of FIG. 2.

Accordingly, connection pillars may be formed on the top substrate using Steps S81 through S83 described above. Although Steps S81 through S83 are described using copper pillars as an example, it should be noted that a similar approach may be adopted for forming pillars made of other metals. For example, in one embodiment, a seed layer for forming aluminum pillars may be deposited, and the aluminum pillars may be subsequently formed by plating the seed layer and etching the plated aluminum layer.

The connection pillars in the inventive concept are not limited to any particular shape or size, so long as the connection pillars can provide adequate mechanical support for the image sensor device. The shape and size of the connection pillars may depend on the shape and size of the seed layer. The connection pillars may be formed having different sizes and shapes (for example, cylindrical, elliptic cylindrical, square, or polygonal).

Embodiments of an image sensor device and a method for forming the image sensor device have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. An image sensor device comprising:
   a top substrate including a plurality of connection pillars; and
   a subassembly including a plurality of connection pads,
   wherein a first bonding surface of the plurality of connection pillars and a second bonding surface of the plurality of connection pads have a substantially similar width in a plan view,
   wherein the connection pillars on the top substrate are directly bonded to the connection pads in the subassembly by metallic compression bonding, and
   wherein the connection pillars are formed of a first metal and the connection pads are formed of a second metal.

2. The image sensor device according to claim 1, wherein the top substrate is made of glass.

3. The image sensor device according to claim 1, wherein the subassembly includes a bottom substrate made of silicon.

4. The image sensor device according to claim 3, wherein the connection pads are disposed at two end portions of the bottom substrate.

5. The image sensor device according to claim 1, wherein the subassembly includes an optically transmissive region, and
   wherein the connection pads are disposed outside the optically transmissive region in the subassembly.

6. The image sensor device according to claim 1, wherein the first metal and the second metal are copper.

7. The image sensor device according to claim 1, wherein the first metal is aluminum and the second metal is germanium.

8. The image sensor device according to claim 3, wherein the subassembly further comprises:
   a plurality of optical components disposed on the bottom substrate,
   wherein the connection pads are disposed adjacent to the edge-most optical components on the bottom substrate.

9. A method of manufacturing an image sensor device, comprising:
   forming a plurality of connection pillars on a top substrate;

providing a subassembly comprising a plurality of connection pads; and bonding the connection pillars on the top substrate to the connection pads in the subassembly by direct metallic compression bonding, wherein a first bonding surface of the plurality of connection pillars and a second bonding surface of the plurality of connection pads have a substantially similar width in a plan view, wherein the connection pillars are formed of a first metal and the connection pads are formed of a second metal.

10. The method according to claim 9, wherein the top substrate is made of glass.

11. The method according to claim 9, wherein the subassembly includes a bottom substrate made of silicon.

12. The method according to claim 11, wherein the connection pads are formed at two end portions of the bottom substrate.

13. The method according to claim 9, wherein the subassembly includes an optically transmissive region, and wherein the connection pads are disposed outside the optically transmissive region in the subassembly.

14. The method according to claim 9, wherein forming the plurality of connection pillars further comprises:

forming a seed layer on the top substrate;

forming a patterned photoresist on a portion of the seed layer, the patterned photoresist exposing two end portions of the seed layer;

electroplating the seed layer using the patterned photoresist as a mask, so as to form the connection pillars at the two end portions of the seed layer; and removing the patterned photoresist and the portion of the seed layer.

15. The method according to claim 9, wherein forming the plurality of connection pillars further comprises:

forming a seed layer on the top substrate;

electroplating the seed layer to form a metal layer; and etching the metal layer so as to form the connection pillars at two end portions of the metal layer.

16. The method according to claim 9, wherein the first metal and the second metal are copper.

17. The method according to claim 9, wherein the first metal is aluminum and the second metal is germanium.

18. The method according to claim 11, wherein the subassembly further comprises:

a plurality of optical components disposed on the bottom substrate, wherein the connection pads are disposed adjacent to the edge-most optical components on the bottom substrate.

19. The method according to claim 9, wherein the connection pillars on the top substrate are bonded to the connection pads in the subassembly at a bonding temperature ranging from about 200° C. to about 500° C., a bonding pressure ranging from about 10 kN to about 100 kN, and a bonding time ranging from about 0.5 hrs to about 3 hrs.

\* \* \* \* \*